United States Patent
Luo et al.

(10) Patent No.: US 7,191,417 B1
(45) Date of Patent: Mar. 13, 2007

(54) METHOD AND APPARATUS FOR OPTIMIZATION OF DIGITAL INTEGRATED CIRCUITS USING DETECTION OF BOTTLENECKS

(75) Inventors: Yufeng Luo, San Jose, CA (US); Prasanna Venkat Srinivas, Cupertino, CA (US); Shankar Krishnamoorthy, Saratoga, CA (US)

(73) Assignee: Sierra Design Automation, Inc., Santa Clara, CA (US)

(*) Notice: Subject to any disclaimer, the term of this patent is extended or adjusted under 35 U.S.C. 154(b) by 172 days.

(21) Appl. No.: 10/860,813

(22) Filed: Jun. 4, 2004

(51) Int. Cl.
*G06F 17/50* (2006.01)

(52) U.S. Cl. ............ 716/6; 716/9; 716/10; 716/13; 716/14

(58) Field of Classification Search ........... 716/6, 716/9, 10, 13, 14
See application file for complete search history.

(56) References Cited

U.S. PATENT DOCUMENTS

| | | | | |
|---|---|---|---|---|
| 5,218,551 A * | 6/1993 | Agrawal et al. | ........... | 716/10 |
| 6,223,328 B1 * | 4/2001 | Ito et al. | ........... | 716/6 |
| 6,286,128 B1 * | 9/2001 | Pileggi et al. | ........... | 716/18 |
| 6,622,291 B1 * | 9/2003 | Ginetti | ........... | 716/9 |
| 6,678,871 B2 * | 1/2004 | Takeyama et al. | ........... | 716/6 |
| 6,757,877 B2 * | 6/2004 | Stenberg et al. | ........... | 716/6 |
| 6,904,585 B2 * | 6/2005 | Brittain et al. | ........... | 716/13 |
| 7,036,103 B2 * | 4/2006 | Miller et al. | ........... | 716/9 |
| 7,055,120 B2 * | 5/2006 | Teig et al. | ........... | 716/10 |
| 7,111,268 B1 * | 9/2006 | Anderson et al. | ........... | 716/11 |
| 7,127,695 B2 * | 10/2006 | Huang et al. | ........... | 716/10 |
| 7,134,112 B1 * | 11/2006 | Anderson et al. | ........... | 716/13 |
| 2001/0010090 A1 * | 7/2001 | Boyle et al. | ........... | 716/2 |
| 2001/0047507 A1 * | 11/2001 | Pileggi et al. | ........... | 716/8 |
| 2002/0083398 A1 * | 6/2002 | Takeyama et al. | ........... | 716/1 |
| 2003/0005398 A1 * | 1/2003 | Cho et al. | ........... | 716/8 |
| 2003/0009727 A1 * | 1/2003 | Takeyama et al. | ........... | 716/1 |
| 2003/0163797 A1 * | 8/2003 | Stenberg et al. | ........... | 716/13 |
| 2004/0015803 A1 * | 1/2004 | Huang et al. | ........... | 716/10 |
| 2004/0044979 A1 * | 3/2004 | Aji et al. | ........... | 716/13 |

(Continued)

FOREIGN PATENT DOCUMENTS

JP 07105278 A * 4/1995

(Continued)

OTHER PUBLICATIONS

Hu et al., "Performance driven global routing through gradual refinement", Proceedings. of 2001 International Conference on Computer Design, Sep. 23-26, 2001, pp. 481-483.*

(Continued)

*Primary Examiner*—Phallaka Kik
(74) *Attorney, Agent, or Firm*—O'Melveny & Myers LLP

(57) ABSTRACT

A method and apparatus is described which allows efficient optimization of integrated circuit designs. By performing a global analysis of the circuit and identifying bottleneck nodes, optimization focuses on the nodes most likely to generate the highest return on investment and those that have the highest room for improvement. The identification of bottleneck nodes is seamlessly integrated into the timing analysis of the circuit design. Nodes are given a bottleneck number, which represents how important they are in meeting the objective function. By optimizing in order of highest bottleneck number, the optimization process converges quickly and will not get side-tracked by paths that cannot be improved.

22 Claims, 5 Drawing Sheets

U.S. PATENT DOCUMENTS

| | | | |
|---|---|---|---|
| 2004/0199884 A1* | 10/2004 | Brittain et al. | 716/4 |
| 2004/0230931 A1* | 11/2004 | Barbee et al. | 716/10 |
| 2004/0243964 A1* | 12/2004 | McElvain et al. | 716/12 |
| 2006/0090151 A1* | 4/2006 | Miller et al. | 716/8 |

FOREIGN PATENT DOCUMENTS

| | | | |
|---|---|---|---|
| JP | 08123468 A | * | 8/1996 |
| JP | 2000172738 A | * | 6/2000 |

OTHER PUBLICATIONS

Albrecht et al. "Floorplan evaluation with timing-driven global wireplanning, pin assignment, and buffer/wire sizing", Proceedings of ASP-DAC 2002, 7th Asia and South Pacific and the 15th International Conference on VLSI Design, Jan. 7-11, 2002, pp. 580-587.*

Goel, Nanotechnology circuit design—the "interconnect problem", Proceedings of the 2001 1st IEEE Conference on Nanotechnology, Oct. 28-30, 2001, pp. 123-127.*

Kumthekar et al., "Power and delay reduction via simultaneous logic and placement optimization in FPGAs", Proceedings of Design, Automation and Test in Europe Conference and Exhibition, Mar. 27-30, 2000, pp. 202-207.*

Esbensen, "EXPLORER: an interactive floorplanner for design space exploration", Proceedings of Design Automation Conference, 1996, with EURO-VHDL '96 and Exhibition, Sep. 16-20, 1996, pp. 356-361.*

Alpert et al. "Minimum density interconnection trees", 1993 IEEE International Symposium on Circuits and Systems, vol. 3, May 3-6, 1993, pp. 1865-1868.*

* cited by examiner

METHOD AND APPARATUS FOR OPTIMIZATION OF DIGITAL INTEGRATED CIRCUITS USING DETECTION OF BOTTLENECKS

FIELD OF THE INVENTION

This invention relates to the field of computer-aided design of integrated circuits, and more specifically to circuit optimization in conjunction with physical synthesis.

BACKGROUND OF THE INVENTION

Integrated circuit design is an increasingly complex process and relies heavily on the use of computer-based tools. In general terms, the design of an integrated circuit involves the translation of user specifications into lower level representations, and the optimization of those lower level representations. The sequence of steps used to go from a high level specification to a chip layout is known as a design flow.

In one embodiment of a design flow, a designer writes an RTL (register transfer level) representation of a circuit, which then gets translated into a collection of interconnected gates during an RTL synthesis phase. Then, during a physical synthesis phase, the gates representing the circuit get placed and optimized, resulting in a collection of placed gates. In the final stage, detailed routing is performed and an integrated circuit layout is generated.

RTL synthesis generally involves the translation of a design at an architectural level into individual gates, specified by a netlist of connected library components. Physical synthesis generally involves the translation and optimization of the netlist into placed gates. The optimization that is performed in conjunction with the physical synthesis phase typically involves techniques such as re-sizing of components, Boolean restructuring and buffer insertion.

Any stage in a design flow may be iterative, and often the results of one phase are fed back to an earlier phase. For example, if physical synthesis and optimization is not able to achieve the target clock frequency, the designer may re-structure the RTL representation of the circuit and then perform the RTL synthesis phase again.

Often integrated circuit design projects are very schedule constrained. In order to get a device manufactured and meet a market opportunity, it needs to be synthesized and optimized as quickly as possible. In the case of physical synthesis of large integrated circuits, designers often strive for performing iterations of optimizations where the optimization phase is run overnight. This allows analysis and refinement during the next day. As integrated circuits have increased in complexity, it is becoming increasingly difficult to optimize the physical synthesis satisfactorily within this allotted time frame.

For example, while chip capacity has quadrupled as feature sizes have decreased from 180 nanometers to 90 nanometers, integrated circuit design tool capacity for overnight closure has not increased by the same amount, resulting in delayed schedules and higher design resource costs. In current generation implementation tools, physical synthesis is often the biggest limitation on the overall design flow. Existing physical synthesis approaches rely extensively on computationally expensive techniques, such as iterative improvement and brute-force trial-based optimization resulting in long turnaround times.

One of the reasons the physical synthesis phase of an integrated circuit design is such a large limitation in current design flows is due to the complexity and scope of what needs to be performed. During physical synthesis, a circuit is typically optimized by replacing circuit elements to decrease the worst case delay through the circuit. Traditional physical synthesis approaches perform optimization by working on the design one path at a time. A path is a sequence of nodes that a signal travels along between a start point and an end point, where a node is a pin of a device. Typically, the worst path (i.e., the path that fails to meet the timing requirements by the greatest amount, also called the critical path) is identified and then optimized by traversing the nodes along this worst path and optimizing such nodes. This process is repeated sequentially on each and every worst path.

Path enumeration of all paths between start points and end points can be very expensive. Prior art methods rely on path enumeration to fix each path from start point to end point. Even if heuristics are employed to reduce the number of paths enumerated, the solution is still exponential in nature. This approach, being exhaustive, can yield good results when the design is constrained properly. However, as the size of the circuit graph grows, the time it takes to complete such exhaustive optimization becomes infeasible as the number of critical paths can grow exponentially.

Additionally, prior art techniques can very easily get trapped with one bad end point especially if it has a bad constraint. A bad constraint may create timing requirements that are impossible to meet. In such a case, the process may not converge and may cause impractically long runtimes even for small designs.

Thus, there is a need to reduce the computational effort required to optimize circuit designs during physical synthesis. In particular, there is a need to efficiently perform a global analysis of a circuit design, avoiding path enumeration, and still be able to visit sufficient nodes in the circuit graph to optimize the objective function. Additionally, there is a need to optimize a circuit design without getting distracted by bad constraints.

SUMMARY OF THE INVENTION

An object of the present invention is to reduce the computational effort required to optimize a physical design. The approach is to identify "bottleneck" nodes in the circuit graph and to optimize those bottleneck nodes. Bottleneck nodes are broadly defined based on their return on investment and their room for improvement. The return on investment for optimizing a node is a measure of the degree to which the overall objective is improved when the node is optimized. Nodes that transitively fan out to many critical end points in general have a higher return on investment than nodes that fan out to fewer critical end points. The room for improvement is the degree to which it is possible to optimize a node. In some cases a node is already close to its optimal performance. Thus, even if such a node has a high return on investment, we may prefer to choose another node that can be optimized to a greater extent.

In one embodiment, the present invention performs a timing analysis of a circuit design. A global analysis is performed to identify the performance optimization bottlenecks and a bottleneck number is assigned to each node that is the output terminal of a component (i.e. a component output node). Optimization is then performed based on the value of the bottleneck number. The bottleneck number reflects the number of critical nodes that are downstream and a delay through the component associated with the node.

A breadth-first traversal of the circuit from end points to start points can be performed in which weights are assigned to each node and bottleneck numbers are assigned to each component output node. This breadth-first traversal may be integrated with the timing analysis of the circuit.

The optimization sequence involves selecting one or more nodes with substantially the largest bottleneck numbers and optimizing those nodes. Then an incremental timing analysis is performed and the sequence is repeated until a termination condition is met. A second optimization sequence utilizing a different formula for weight and bottleneck number may then be performed until a second termination condition is met.

DETAILED DESCRIPTION OF THE PREFERRED EMBODIMENT

Figure 1:
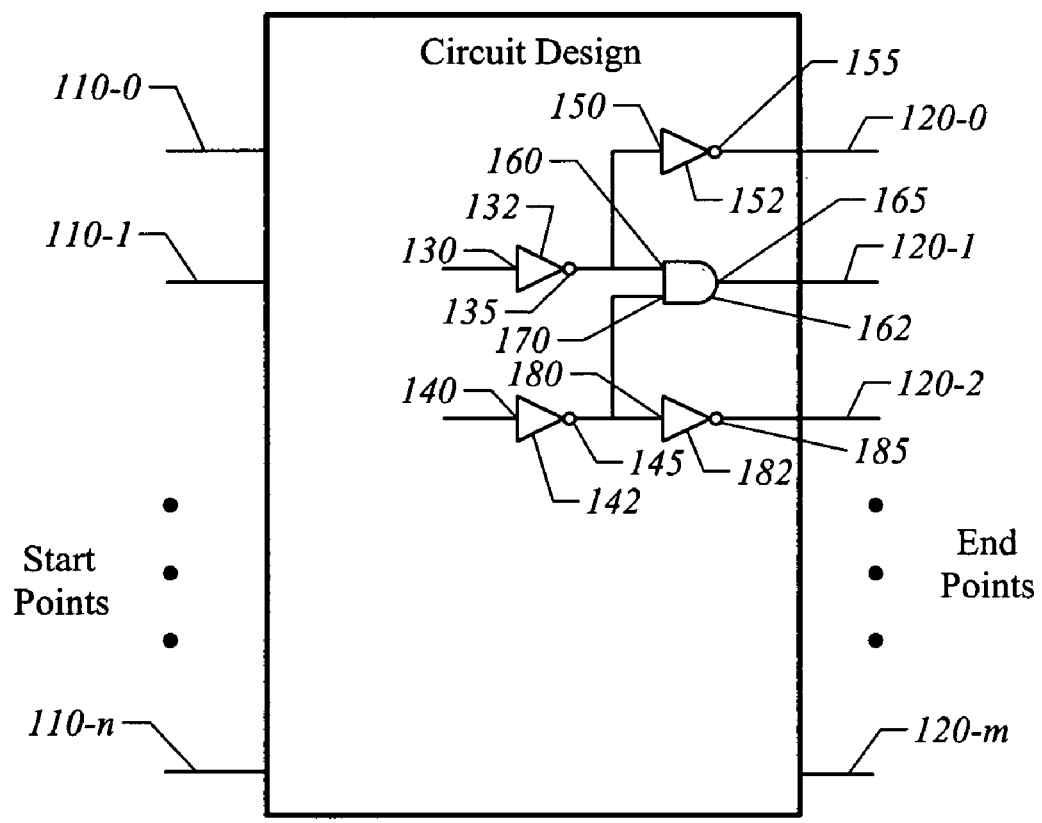
FIG. 1 is a diagram illustrating an exemplary circuit design showing start points, end points, and intermediate nodes.

The present invention dramatically reduces the computational effort to perform physical synthesis on large circuit graphs by using a new technique that identifies "bottleneck" nodes in the circuit graph and optimizes these bottleneck nodes. This approach performs a global analysis of the design for performance bottlenecks and dramatically reduces the execution time of physical synthesis in that no path enumeration is required. The approach is computationally very efficient and also robust in the presence of bad constraints.

The goal of physical synthesis optimization engines is to optimize multiple objectives—timing, slew, capacitance, leakage, etc. The goal of any optimizer is to improve the paths between some predefined start points and end points. Any path in the circuit graph has a constraint for the time that is allocated for a signal to reach the end point from a start point. The goal of the optimization phase is to reduce the time required for the signal to travel from each start point to each end point to be under the constraint allocated. The goal is to reduce the violation down to zero.

In general, an optimization may take place on a circuit block that includes inputs from other blocks, outputs to other blocks and clocked registers. Some paths start at block inputs and some paths start at clocked registers. Similarly, some paths end at block outputs and some paths end at registers. In the case of block inputs and outputs, the timing constraints are specified by the user as part of the block interface requirement. In the case of paths that start and end at registers, the timing requirement is constrained by the target clock period. Often, the timing constraints of input-to-register paths and register-to-output paths are less precise than the timing constraints of register-to-register paths.

Timing Analysis

Physical synthesis generally operates on a netlist of connected components. This netlist is represented as a graph of connected nodes where each node represents a pin on a circuit element, such as a buffer or a gate. Nodes can receive signals from multiple sources (fan-in) and they can generate signals to multiple destinations (fan-out). During conventional timing analysis, each node in a circuit is evaluated with respect to timing requirements, and each node is given a "slack." The "slack" of a given node in a circuit is the difference between the actual arrival time and the required arrival time of the signal at that node. In the case of fan-in and fan-out, the slack is computed using the maximum (i.e., the latest) arrival time and the minimum (i.e., earliest) required time.

If the required time for a node is smaller than the arrival time for that node, then this node does not meet timing and has a negative slack value. The magnitude of the negative value is the amount that is fails to meet the specified timing. It is customary to specify the worst (i.e. largest in magnitude) negative slack ("WNS") for a given circuit. This is the largest negative value for all nodes of the circuit. The WNS characterizes the critical path for the circuit and in the case of register-to-register paths indicates how much slower the circuit has to be clocked compared to the specified constraint. Another characterization of a circuit is the total negative slack ("TNS"), which is the sum of all of the negative slacks for all end points of the circuit. Optimizations that do not affect the critical path may decrease the total negative slack, but may not affect the worst negative slack. The TNS can be thought of as characterizing the overall quality of the design, in that it represents generally how close the circuit is to meeting the timing objective. The TNS can also be considered as a measure of the engineering effort required to make the circuit meet timing.

For example, a circuit expected to run at 250 Mhz would have a target clock period of 4.0 ns. If a given synthesis of the circuit has a worst negative slack of −1.8 ns across all register-to-register paths, this means that the fastest the circuit can be clocked is 5.8 ns, or 172 Mhz. In this case, prior art optimizers will typically attempt to make changes on a path that includes nodes with the worst negative slack. This can be done by resizing gates or inserting buffers. Once this path is optimized, another path may have the worst negative slack, and thus would represent the critical path in the design. In this way, the physical synthesis optimizer will typically attempt to optimize the circuit so that all paths have a positive slack. Once this condition is satisfied, the circuit is expected to meet the target clock period.

The prior art resorts to expensive path enumeration to improve the total negative slack of the design. Such traditional approaches are computationally very expensive as the design could contain numerous critical paths. These approaches are categorized as incremental and greedy since no attempt is made to analyze the nodes in the circuit graph globally over all paths. In many cases, a circuit is incapable of being optimized to meet the target clock period. This could be due to an unrealistic target clock period. Prior art optimizers often get distracted by the worst path in the design and can spend excessive computational effort attempting to optimize an impossible path, while making little or no progress in reducing the TNS of the design.

FIG. 1 illustrates an example of a representation of a circuit design showing start points, end points and some intermediate nodes. This represents an example circuit to be optimized. As discussed above, generally start points and end points can be categorized into three groups: inputs, outputs and registers. Inputs and outputs are signals that connect other blocks that are being optimized separately. Register start points are signals that originate from registers and register end points are signals that terminate at registers.

In order for the registers to be clocked at a fixed rate, signals must be able to propagate from all register start points to all register end points within the target clock period. Start points 110-0 through 110-n may start at registers or may be block inputs in any combination. Similarly, end points 120-0 through 120-m may end at registers or may be block outputs in any combination.

Signals traveling from the start points to the end points can go through numerous paths and can experience fan-out and fan-in. Node 135 is connected to nodes 150 and node 160, and as such illustrates an example of fan-out. Similarly node 145 fans out to nodes 170 and 180. Node 165 is connected to an AND gate which fans in from nodes 135 and 145. Only a portion of the nodes have been shown for illustration purposes.

During conventional timing analysis, the slack of each node in the circuit is computed. This is done by traversing the circuit from start points to end points in a breadth-first manner and computing the arrival times of every signal using the delay through each component and the delay across each interconnection. The arrival times of input start points are specified by the external conditions while the arrival times of register start points are set to zero. In the case that a node receives signals from multiple upstream nodes with different arrival times, the latest arrival is used to compute the arrival time of the node. This procedure allows the arrival times for all end points to be computed.

Once the arrival times for all end points are known, the required times for all nodes in the circuit are computed. This is performed using a backward breadth-first traversal of circuit from end points to start points. The required times for output end points are specified by the external conditions while the required times for register end points are set based on the target clock period. In the case that a node drives multiple downstream nodes with different required times, the earliest required time is utilized to compute the required time of the node. For each node in the circuit, the difference between the arrival time and the required time is the slack of that node.

Global Optimization Bottleneck Definition

Once the slacks of all nodes in a circuit are known, the worst negative slack (WNS) is known and any node with this WNS is said to reside on a critical path. Note that there can be many critical paths and enumeration of all paths between start points and end points can be very expensive. Prior art methods rely on path enumeration to fix each path from start point to end point. In certain cases, heuristics have been employed to reduce the number of paths that are enumerated, but the problem is still exponential in nature. In prior art mechanisms, the timing cost of a circuit is approximated by looking at the slacks of the end points. If they were to look at start point-end point combination, there would be a large explosion in data.

The present invention avoids path enumeration and yet is still able to visit sufficient nodes in the circuit graph to optimize the objective function. Instead of relying on heuristics, the approach described below systematically discovers nodes with a high "return on investment." That is, nodes for which optimization will have the most benefit on the overall performance of the circuit. Rather than enumerate paths, the approach described in this specification performs a global analysis of the performance optimization bottlenecks and identifies them efficiently. The result of the global analysis is biased in favor of the worst path, but also considers other paths with negative slack, and for this reason it will not get distracted by the worst path in the design to the exclusion of others.

One embodiment of the present invention goes through two stages in the optimization sequence, a global optimization phase and a local optimization phase. In the global optimization phase, we are more interested in reducing the TNS of the design and therefore want to look at all critical nodes. A critical node is any node with a negative slack. A critical end point is any end point with a negative slack. During the global optimization phase, a node that fans out to many critical end points that are not on the critical path may be more interesting to optimize than one that fans out to a single WNS end point. We also want to focus on nodes that have a high room for improvement, rather than on nodes that are already close to optimal. During the local optimization phase, we concentrate only on nodes that are on the critical path, while still considering the fan-out of those WNS nodes.

A goal of the present invention is to rapidly detect the bottlenecks of a design. A "bottleneck" is defined as a node in the circuit graph that if optimized will lead to maximal improvement of the objective function. The "criticality factor" or "bottleneck number" of a node reflects the extent to which optimization of the node can result in improvement of the objective function. One embodiment of the present invention assigns a bottleneck number to substantially every component output node during timing analysis. A component output node is a node that is an output pin of a component, for example the output pin of a buffer or gate. Note that some components may have multiple output pins, and therefore multiple component output nodes. We only assign bottleneck numbers to component output nodes, although substantially every node in the circuit is examined in the process of assigning bottleneck numbers. The bottleneck numbers are then used to identify the order in which nodes are optimized.

Bottleneck numbers can be defined for all type of objective functions, e.g., timing, slew violation, capacitance violation, area, leakage, etc. For each of the common objectives of physical synthesis, the definition of a bottleneck would vary. The basic idea is that of finding nodes with a high return on investment and a high room for improvement. For a timing objective optimization, the bottlenecks are generally the circuit nodes that transitively fan out to a large number of critical end points and have high load-dependent delays.

Identifying a timing bottleneck requires traversal of the transitive fan out of each node to compute the bottleneck number of a node. To do this a breadth-first traversal of the nodes in the circuit design is performed starting from the end points and ending with the start points.

The goal is to make the most critical end points more prominent in determining the criticality of the node in the circuit graph. Timing analysis avoids path enumeration and is made computationally efficient by taking the maximum of the arrival times and the minimum of the required times at a node. Since we can already compute end point slack efficiently using timing analysis, the timing analysis step can be enhanced to perform the bottleneck number computation.

The computation of the bottleneck number for a timing objective function begins with a computation of the "weight" of each node. First, each end point is assigned a weight defined as:

if (slack$\geq$0) weight=0

$$\text{if (slack} < 0) \text{ weight} = \left(\frac{\text{slack}}{WNS}\right)^2$$

Starting from all end points whose weight is greater than zero, we initiate a backward breath-first traversal of the circuit graph. If a node has a non-negative slack, it is assigned a zero weight. For each node with a negative slack, we sum up the weights from its downstream nodes. This becomes the weight of this node, which varies with the negative slack of the end points to which they fan out, as well as to how many such end points they fan out.

After the weight has been computed for a node, we then compute the bottleneck number for that node in the case that it is a component output node. If a component output node has a non-negative slack, it is assigned a bottleneck number of zero. If a component output node has a negative slack, it is assigned a bottleneck number as follows:

$$B_t = \sqrt{\text{weight}} \cdot LDD \cdot \left(\frac{\text{slack}}{WNS}\right)^2$$

where weight and slack are the weight and slack of the node, respectively, and LDD is the load-dependent delay of the component associated with the node. The traversal terminates at the start points of the circuit graph. The weight of a node is a measure of the relative criticality of this node. In a preferred embodiment, a data structure is utilized to dynamically keep a list of the worst bottlenecks in the design. As the circuit graph is traversed and bottleneck numbers are assigned to each node, the data structure is maintained such that a sorted list of nodes, ordered by bottleneck number, is available.

The idea behind the weights is to establish a quantitative measure of how important each node is contributing to the negative slack in the design. Note that the value of the weight at each end point will be a number between zero and one, inclusive. It is zero at end points that meet timing, and it is one at the worst end points. At end points that do not meet timing but are not the worst end points, the weight will have a value somewhere between zero and one. By performing a reverse flow analysis and summing the weights, we will weight nodes higher that fan out to more critical nodes. Because the reverse flow analysis is a single breadth-first traversal of the circuit design, it is not exponential and requires visiting each node only once.

The bottleneck number quantitatively measures nodes that are likely to improve the timing, and have room for improvement. This allows the optimization to converge quickly and not get side-tracked by nodes that have very little room for improvement.

The square root function is thus used to dampen the enthusiasm of the optimizer to just prefer the high weight bottlenecks. We are more interested in slow cells that have high negative slack and which have high room for improvement. Operating on this cell will improve the cell and its transitive fan out.

The delay used in the bottleneck number formula is the load-dependent delay of the node. Generally each node has three delays associated with it: slew-dependent delay, load-dependent delay and intrinsic delay. In the case of the bottleneck number used during the global optimization phase, only the load-dependent delay is utilized. Nodes with high load-dependent delays are likely to have high room for improvement by replacement with cells with higher drive strength.

Figure 2:
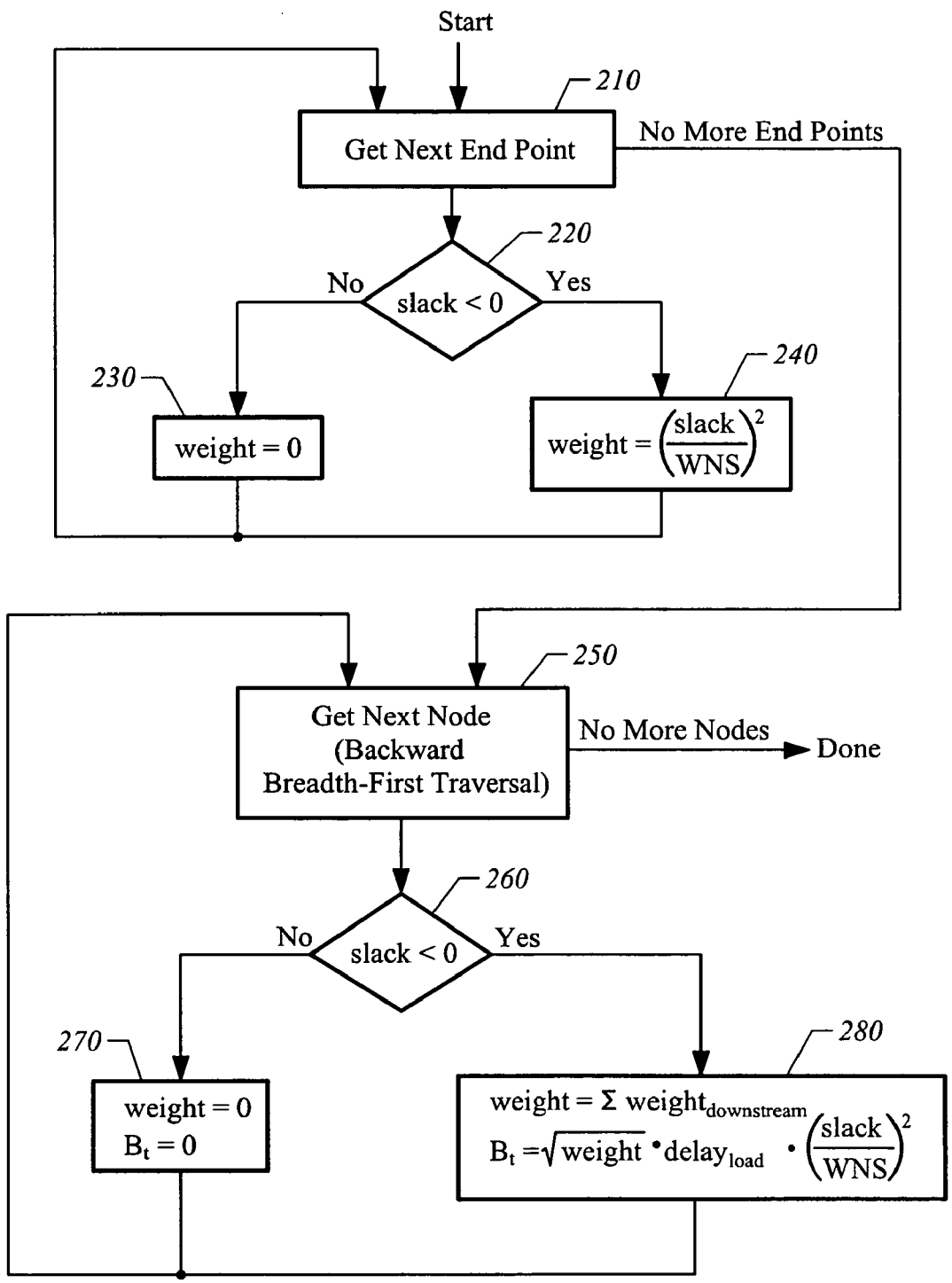
FIG. 2 is a flow chart of the assignment of bottleneck numbers during the global optimization phase of one embodiment of the present invention.

The assignments of bottleneck numbers during the global optimization phase is illustrated in FIG. 2. Steps 210, 220, 230 and 240 represent an iterative loop in which all end points are assigned a weight. In step 210, the next end point not yet processed is identified. If all end points have been processed, the loop terminates and processing continues with step 250. In step 220, the slack of the identified end point is evaluated. If the slack is positive (meaning that the end point meets timing), the end point is assigned a weight of zero in step 230. If the end point has a negative slack, the end point is assigned a weight of the square of the ratio of the slack of the end point and the WNS.

Steps 250, 260, 270 and 280 from FIG. 2 represent an iterative loop which is the backward breadth-first traversal of the circuit in which weights are assigned to each node and bottleneck numbers are assigned to each component output node in the circuit. In step 250, the next node not yet processed is identified. If all nodes have been processed, the loop terminates and the assignment of bottleneck numbers is done. In step 260, the slack of the identified node is evaluated. If the slack is positive, the weight and bottleneck number for the node are assigned zero in step 270. Note that step 270 assigns weights to all nodes and bottleneck numbers only to component output nodes. If the slack is negative, the node is assigned a weight of the sum of the downstream weights of the node in step 280. Also in step 280, if the node is a component output node, the bottleneck number of the node is given a value equal to the square root of the weight, multiplied by the load dependent delay of the node, multiplied by the square of the ratio of the slack of the node to the WNS. Note that in a preferred embodiment, the steps illustrated in FIG. 2 are integrated with timing analysis, so that it is performed during the backward breadth-first traversal of the circuit necessary to compute the required times for each node.

Table 1 below illustrates an example of the bottleneck number computation using a portion of the circuit example illustrated in FIG. 1. The "slack" column in Table illustrates the result of timing analysis of the circuit. In the example illustrated, end point 120-1 is the most critical with a negative slack of 2.0. End point 120-0 is almost as bad with a negative slack of 1.8 and end point 120-2 is not critical and meets timing. Also in this example, components 142 and 162 are on a critical path as their output nodes both have negative slacks of 2.0. Components 132 and 152 are not on a critical path, but they have negative slacks almost as bad as the WNS. Component 182 is on a path that meets timing.

The "slack" column of Table 1 would be filled in by the timing analyzer utilizing the procedure outlined above. The "weight" and "Bt" columns are filled in utilizing the algorithm illustrated in FIG. 2. Note that only nodes that are the outputs of components are assigned bottleneck numbers, while all nodes are assigned weights. Note that node 135 in this example has the highest weight even though it is not on a critical path. If components 132 and 142 both have the same load-dependent delay, node 135 will have a higher bottleneck number and thus will be considered a better candidate for optimization. This illustrates how the nodes selected for optimization may not be nodes on a critical path. This is in contrast to prior art optimization, which typically only considers nodes on a critical path for optimization.

If the load-dependent delay of component 132 is low, node 145 may be the better candidate for optimization. Alternatively, if the load-dependent delays of component 132 and 142 are both low, the best candidate to optimize may be node 165. Table 1 illustrates that the bottleneck number is dependent on how the node is connected to the rest of the circuit and how much room it has for improvement, allowing fast global convergence.

TABLE 1

Global Bottleneck Number Assignment Example

| FIG. 1 End Point/Node | slack | weight | $B_t$ |
|---|---|---|---|
| 120-0 | −1.80 | 0.81 | |
| 120-1 | −2.00 | 1.00 | |
| 120-2 | 0.00 | 0.00 | |
| 155 | −1.80 | 0.81 | $0.73 \cdot LDD_{152}$ |
| 165 | −2.00 | 1.00 | $1.00 \cdot LDD_{162}$ |
| 185 | 0.00 | 0.00 | 0.00 |
| 150 | −1.80 | 0.81 | |
| 160 | −1.80 | 1.00 | |
| 170 | −2.00 | 1.00 | |
| 180 | 0.00 | 0.00 | |
| 135 | −1.80 | 1.81 | $1.09 \cdot LDD_{132}$ |
| 145 | −2.00 | 1.00 | $1.00 \cdot LDD_{142}$ |
| 130 | −1.80 | 1.81 | |
| 140 | −2.00 | 1.00 | |

In alternative embodiments, other objective functions could be utilized besides timing objective functions. For slew objective optimization, the bottleneck nodes are the circuit nodes that have large transition times that violate the transition constraint on the design. For capacitance objective optimization, the bottleneck nodes are the circuit nodes that have large capacitance violations. In some embodiments, the bottleneck values for slew and capacitance objective functions are local properties and no circuit traversal is needed. In other embodiments, it may be desirable to incorporate the weight of a node as defined above into a slew or capacitance bottleneck number.

For example, the slew slack for a node could be multiplied with the square root of the weight of a node to come up with a slew bottleneck number. In this case the circuit would be traversed to compute the weight of each node and then the slew bottleneck number would be computed for each component output node. For each objective function, nodes are sorted based on their bottleneck values. The node with the highest bottleneck value (thus indicating highest potential return on investment) is optimized first.

Local Refinement

In a preferred embodiment, the global optimization phase terminates based on a termination criteria, and then local refinement is performed. During local refinement, a different approach is needed to find the timing bottlenecks in the design. In local refinement, the difference in negative slacks is not as great as it was in global refinement. Sometimes, it may not be feasible to obtain zero negative slack, so it is important to focus on the worst critical end points instead of all negative end points. The importance of criticality factor now diminishes in favor of the cell delay. Two parameters are changed in the bottleneck analysis to achieve this, the definition of the weight is changed and the formula for the bottleneck number is changed.

In the local refinement mode, instead of using the previous weight formula, the end points are given a weight as follows:

if (slack≠WNS) weight=0 if (slack=WNS) weight=1

Then, starting from all end points whose weight is greater than zero, we initiate a backward breath-first traversal of the circuit graph. If a node has a slack not equal to the WNS, it is assigned a zero weight. For each node with a slack equal to the WNS, we sum up the weights from its downstream nodes. This becomes the weight of this node, which varies with the number of WNS end points it fans out to. After the weight has been computed for a node, we then compute the bottleneck number for nodes that are component output nodes. If the slack of a component output node is not equal to the WNS, it is assigned a bottleneck number of zero. If the slack of a component output node is equal to the WNS, it is assigned a bottleneck number as follows:

$$B_t = \sqrt[3]{\text{weight}} \cdot \text{DELAY}$$

where weight is the weight of the node and DELAY is the overall delay of the component output for the node. Thus, the cell delay and the cubic-root of the weight primarily influence the identification of the bottlenecks. This shrinks the range of the cells that are visited during local optimization to bias them to work on the worst paths. The goal of the algorithm is to fine-tune the existing critical paths quickly.

Figure 3:
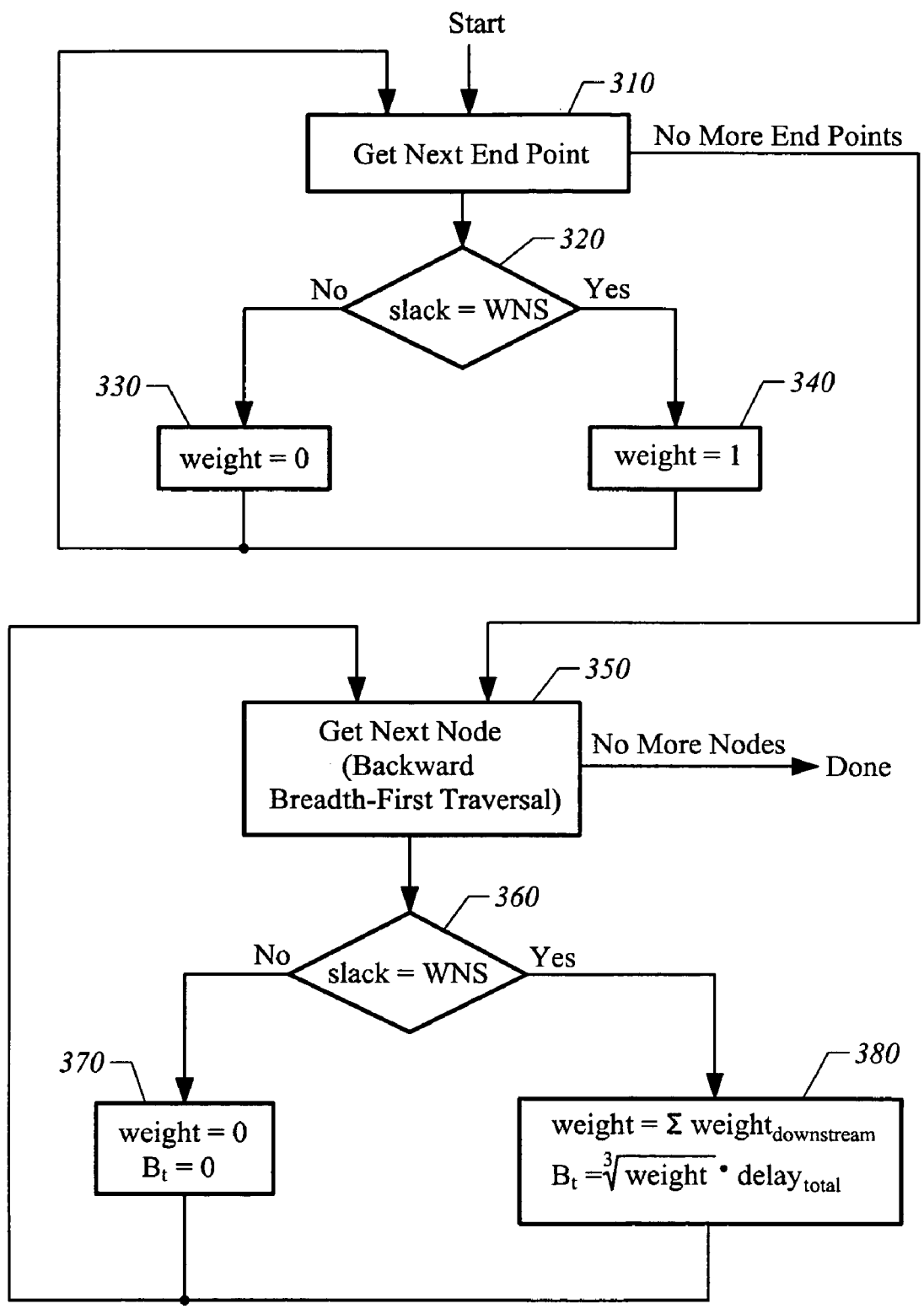
FIG. 3 is a flow chart of the assignment of bottleneck numbers during the local optimization phase of one embodiment of the present invention.

The steps of assigning bottleneck numbers in the local refinement mode are illustrated in FIG. 3. Steps 310, 320, 330 and 340 represent an iterative loop in which all end points are assigned a weight. In step 310, the next end point not yet processed is identified. If all end points have been processed, the loop terminates and processing continues with step 350. In step 320, the slack of the identified end point is evaluated. If the slack is not equal to the WNS (meaning that the end point is not on a critical path), the end point is assigned a weight of zero in step 330. If the end point has a negative slack equal to the WNS, the end point is assigned a weight of one.

Steps 350, 360, 370 and 380 from FIG. 3 represent an iterative loop which is the backward breadth-first traversal of the circuit in which weights are assigned to each node and bottleneck numbers are assigned to each component output node in the circuit. In step 350, the next node not yet processed is identified. If all nodes have been processed, the loop terminates and the assignment of bottleneck numbers is done. In step 360, the slack of the identified node is evaluated. If the slack is not equal to the WNS, the weight and bottleneck number for the node are assigned zero in step 370. Note that step 370 assigns weights to all nodes and bottleneck numbers only to component output nodes.

If the slack is negative, the node is assigned a weight of the sum of the downstream weights of the node in step 380. Also in step 380, if the node is a component output node, the bottleneck number of the node is given a value equal to the cubic root of the weight, multiplied by the total delay of the node (i.e., the load-dependent delay plus the slew-dependent delay plus the intrinsic delay). Note that in a preferred embodiment, the steps illustrated in FIG. 3 are integrated with timing analysis, so that it is performed during the backward breadth-first traversal of the circuit necessary to compute the required times for each node.

Optimization Sequence

Figure 4:
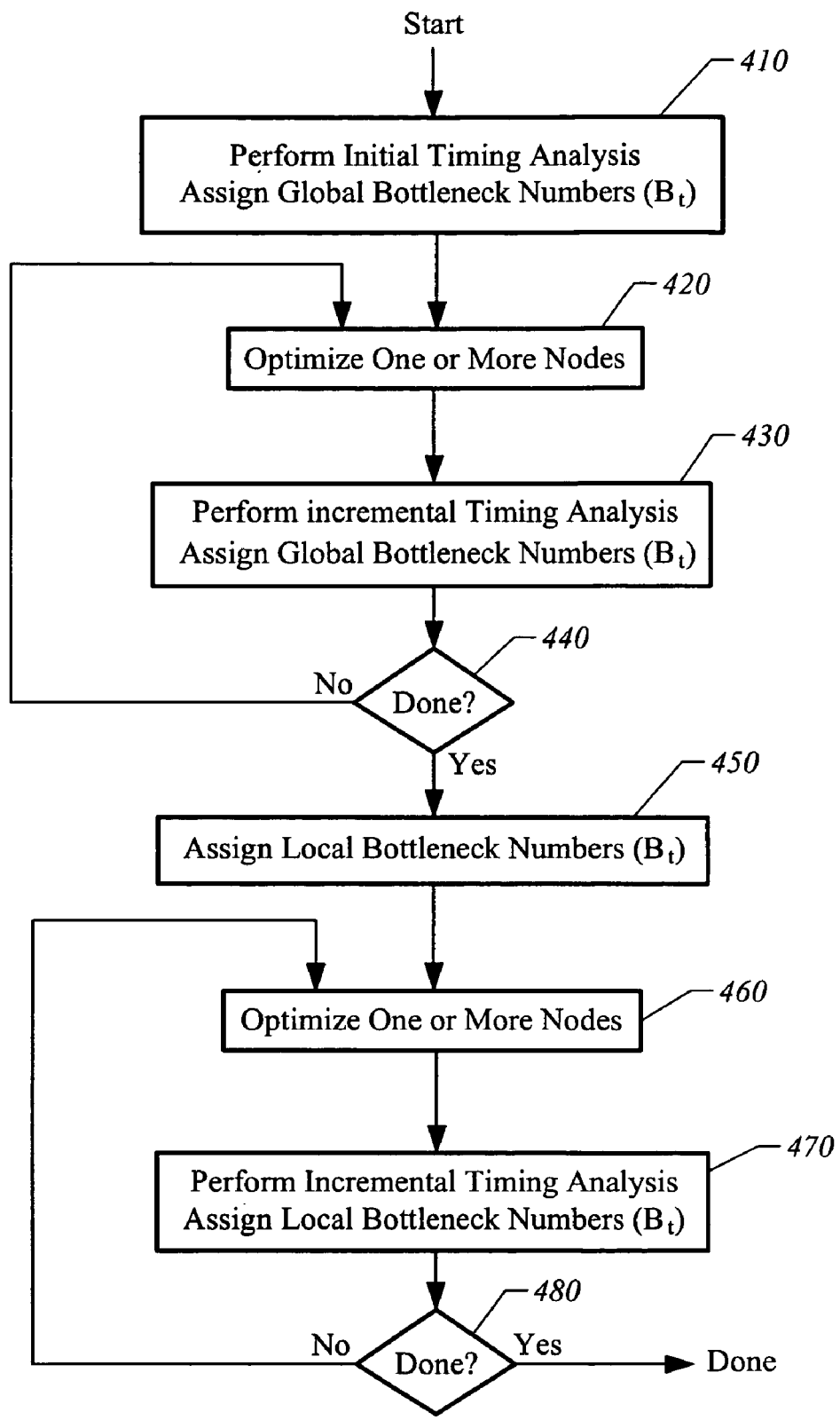
FIG. 4 is a flow chart of the optimization sequence of one embodiment of the present invention.
Figure 5:
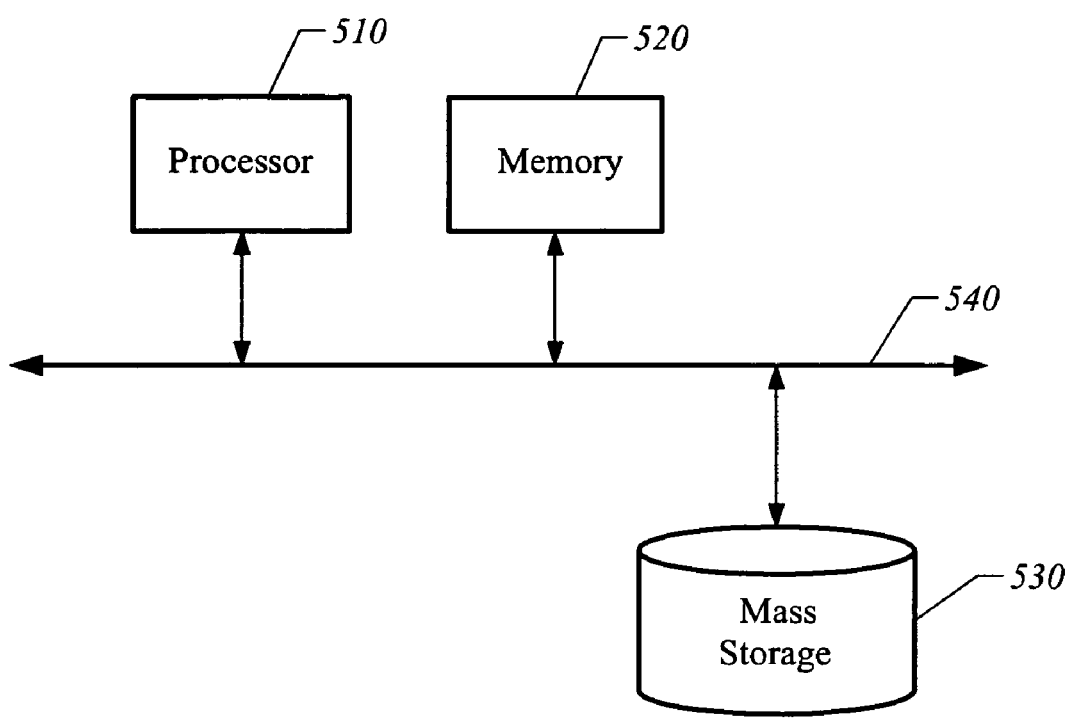
FIG. 5 is a illustration of a computer system incorporating an embodiment of the present invention

FIG. 4 illustrates how the overall optimization sequence is performed in a preferred embodiment. In step 410, an initial timing analysis of the circuit is performed and global bottleneck numbers are assigned to component output nodes as illustrated in FIG. 2. During the timing analysis phase, the bottleneck numbers for multiple virtual timing graphs can be simultaneously computed. The implementation of multiple virtual timing graphs, as disclosed in co-pending application Ser. No. 10/860,812, filed concurrently herewith, for METHOD AND APPARATUS FOR THE ANALYSIS AND OPTIMIZATION OF VARIABILITY IN NANOMETER TECHNOLOGIES, hereby incorporated by reference, may be utilized.

In step 420, one or more nodes are selected for optimization based on their bottleneck numbers. The number of nodes selected could be a single node, or it could be a batch of nodes. The use of a batch increases the overall efficiency of the optimization sequence by allowing multiple nodes to be optimized before timing analysis is performed again. The size of the batch may be fixed or variable, and may be any number from 1 up to the entire circuit. The size of the batch may be adaptive, where it varies according to a optimization-specific criteria. For example, it may be desirable to have larger batches during the early stages of an optimization and have smaller batches during the later stages.

In general, the selection of the nodes within the batch are the nodes with the highest bottleneck numbers. The optimization that is performed for each node is outside the scope of the node selection mechanism and could be of any type. Conventional techniques such as component re-sizing and buffer insertion could be employed, or any other circuit optimization technique that is designed to improve the objective function.

In step 430, an incremental timing analysis of the circuit is performed and global bottleneck numbers are re-computed as illustrated in FIG. 2. Incremental timing analysis is a conventional technique that produces the same results as the initial timing analysis, and is more efficient as it utilizes previously computed information where possible. The timing of circuit elements that have not changed do not need to get re-computed. In step 440, termination criteria are evaluated to determine if the global optimization phase should be terminated. If the termination criteria fails, another iteration of the loop is performed and the process continues with step 420. The termination criteria could be of any type. For example, the global optimization phase could terminate when the improvement made in the last iteration is below a certain threshold.

The global optimization step 420 need not update the bottleneck numbers of the circuit as it is being optimized. However, in an alternative embodiment, this can be performed and may lead to faster and/or better results. In this case, as each node within a batch is optimized, a data structure is incrementally updated to reflect the changes that have been made. In this alternative embodiment, as the design changes due to optimizations of nodes within a batch, a bottleneck data structure is updated with the new nodes that may have been added, and the bottleneck numbers are updated dynamically as the circuit graph changes.

When global optimization terminates, local optimization is started beginning with step 450, in which local bottleneck numbers are assigned to each component output node as illustrated in FIG. 3. In step 460, one or more nodes are selected for optimization based on their bottleneck numbers. As in step 420, the number of nodes selected could be a single node, or it could be a batch of nodes. The size of the batch may be fixed or variable, and may be any number from 1 to a large number that includes a substantial fraction of the entire circuit. The size of the batch may be adaptive, where it varies according to circuit-specific criteria.

As with step 420, the selection of the nodes within the batch are in general the nodes with the highest bottleneck numbers. The optimization that is performed for each node is outside the scope of the node selection mechanism and could be of any type. Conventional techniques such as component re-sizing and buffer insertion could be employed, or any other circuit optimization technique that is designed to improve the objective function.

In a preferred embodiment, nodes are grouped into inputs, outputs and registers according to whether they are on input-to-register paths, register-to-output paths or register-to-register paths. This allows the optimization of register-to-register paths, which have the most precise timing constraints to be performed separately. Often the arrival times of input signals and the required times for output signals are not accurately specified and it is advantageous to not get distracted by poor constraints.

In a preferred embodiment, it is desirable to mark a node once it has been optimized and not select it again to avoid repeated trials at that node. In this case, the bottleneck number for that node would be ignored and it would not be selected even if it has the highest bottleneck number.

In many cases, a circuit is incapable of being optimized to meet the target clock period. This could be due to an unrealistic target clock period. To accommodate these situations, a preferred embodiment of the present invention can mark an end point as "impossible to meet" if it has been optimized as much as possible and still has negative slack. In this case it would be given a weight of zero and thus would not contribute to the computation of bottleneck number.

FIG. 4 illustrates a computer system incorporating an embodiment of the present invention. Processor 410 is utilized to execute instructions performing the steps described above. Memory 420 is used to hold processor instructions and data representing the circuit design. The computer system of FIG. 4 also incorporates mass storage 430 to contain permanent copies of the circuit design files and the cell library used to define the circuit being optimized.

The optimization mechanism described herein can be applied to a wide variety of different objectives. The performance characteristic to be optimized can include the worst negative slack of the design, the total negative slack of the design, the worst slew slack of the design, the worst hold slack of the design, and the total hold slack of the design, among others.

While the invention has been disclosed with respect to several embodiments, it will be evident that various changes may be introduced by those with ordinary skill in the art to which the invention pertains. The forgoing disclosure is therefore intended to be descriptive and not limiting.

What is claimed is:

1. A method of optimizing performance of an integrated circuit design having a plurality of nodes of which a subset are component output nodes, the method comprising the steps of:
    (a) measuring a performance characteristic of said integrated circuit design;
    (b) assigning respective bottleneck numbers to plural ones of said component output nodes, wherein each said bottleneck number characterizes:
        degree to which optimizing an associated one of said component output nodes will improve said performance characteristic of said integrated circuit design; and
        degree to which the associated one of said component output nodes is capable of being altered to improve said performance characteristic, wherein capability of the associated one of said component output nodes to be altered depends at least in part on its associated delay; and (c) optimizing one or more said component output nodes based on said bottleneck numbers.

2. The method of optimizing performance of an integrated circuit design according to claim 1, wherein said performance characteristic comprises one of: total negative slack of said integrated circuit design, worst negative slack of said integrated circuit design, worst slew of said integrated circuit design, total hold slack of said integrated circuit design, and worst hold slack of said integrated circuit design.

3. The method of optimizing an integrated circuit design according to claim 1, wherein the assigning step (b) includes incorporating a term for at least one said component output node that reflects a number of critical end points that are downstream from said at least one said component output node.

4. The method of optimizing performance of an integrated circuit design according to claim 1, wherein the assigning step (b) comprises:
(b1) assigning an end point weight to each end point of said integrated circuit design;
(b2) assigning a node weight to each node of said integrated circuit design; and
wherein said bottleneck number for a component output node is based on the node weight of said node.

5. The method of optimizing performance of an integrated circuit design according to claim 1, wherein the step of measuring a performance characteristic in said step (a) comprises:
(a1) performing a forward breadth-first traversal of said integrated circuit design and assigning arrival times to each node;
(a2) performing a reverse breadth-first traversal of said integrated circuit design and assigning required times to each node; and,
wherein the step of assigning a bottleneck number in said step (b) is performed during said step (a2).

6. The method of optimizing performance of an integrated circuit design according to claim 1, wherein the step of optimizing one or more said component output nodes in said step (c) comprises:
(c1) selecting the component output node with substantially a highest bottleneck number;
(c2) improving timing of the selected component output node.

7. The method of optimizing performance of an integrated circuit design according to claim 6, wherein the step of improving the timing in said step (c2) comprises replacing a component associated with said selected component output node with a different sized equivalent component.

8. The method of optimizing performance of an integrated circuit design according to claim 6, further comprises:
(d) performing an incremental performance analysis of said integrated circuit design after said step (c2).

9. The method of optimizing performance of an integrated circuit design according to claim 8, wherein steps (b), (c) and (d) are repeated until a termination condition is met.

10. The method of optimizing performance of an integrated circuit design according to claim 9, further comprising marking a component output node that has been selected so that said component output node will not be selected again regardless of the bottleneck number associated with said component output node.

11. The method of optimizing performance of an integrated circuit design according to claim 9, wherein the step of assigning a bottleneck number in said step (b) comprises:
(b1) assigning a weight to each end point of said integrated circuit design; and
(b2) assigning a weight to each node of said integrated circuit design; and,
wherein said bottleneck number for a component output node is based on the weight of said component output node.

12. The method of optimizing performance of an integrated circuit design according to claim 9, wherein an end point is marked as impossible to meet; and wherein a weight of said end point is set to zero.

13. The method of optimizing performance of an integrated circuit design according to claim 1, further comprising:
(e) categorizing one or more nodes in said integrated circuit design as belonging to one of categories selected from: input, output and register; and,
wherein optimizing one or more said component output nodes in said step (c) comprises:
(c1) selecting the component output node with substantially a highest bottleneck number within one of said categories;
(c2) improving timing of the selected node.

14. The method of optimizing performance of an integrated circuit design according to claim 1, wherein the associated delay comprises load-dependent delay of the associated one of the component output nodes.

15. The method of optimizing performance of an integrated circuit design according to claim 1, wherein the associated delay comprises total delay of the associated one of the component output nodes.

16. A method of optimizing performance of an integrated circuit design having a plurality of nodes of which a subset are component output nodes, the method comprising the steps of:
(a) measuring a performance characteristic of said integrated circuit design;
(b) assigning respective bottleneck numbers to plural ones of said component output nodes, wherein each said bottleneck number characterizes a degree to which optimizing an associated one of said component output nodes will improve said performance characteristic of said integrated circuit design; and
(c) optimizing one or more said component output nodes based on said bottleneck numbers;
wherein the assigning step (b) comprises:
(b1) assigning an end point weight to each end point of said integrated circuit design;
(b2) assigning a node weight to each node of said integrated circuit design; and
wherein said bottleneck number for a component output node is based on the node weight of said node;
wherein the step of assigning an end point weight to each end point in said step (b1) comprises:
(b1a) if an end point has a non-negative slack, assigning an end point weight of zero to that end point;
(b1b) if an end point has a negative slack, assigning an end point weight to that end point proportional to a ratio of the slack of said end point to a worst negative slack raised to a power greater than one; and
wherein the step of assigning a node weight to each node in said step (b2) comprises:

(b2a) assigning a node weight proportional to a sum of the node weights of all nodes and end point weights of all end points that are directly downstream from said node.

17. A method of optimizing performance of an integrated circuit design having a plurality of nodes of which a subset are component output nodes, the method comprising the steps of:
   (a) measuring a Performance characteristic of said integrated circuit design;
   (b) assigning respective bottleneck numbers to plural ones of said component output nodes, wherein each said bottleneck number characterizes a decree to which optimizing an associated one of said component output nodes will improve said performance characteristic of said integrated circuit design; and
   (c) optimizing one or more said component output nodes based on said bottleneck numbers;
   wherein the assigning step (b) comprises:
      (b1) assigning an end point weight to each end point of said integrated circuit design;
      (b2) assigning a node weight to each node of said integrated circuit design; and
   wherein said bottleneck number for a component output node is based on the node weight of said node;
   wherein the step of assigning a bottleneck number in said step (b) further comprises:
      (b3) computing said bottleneck number for plural ones of said component output nodes proportional to a product of: the weight of said component output node raised to a positive power less than one, said delay associated with said component output node, and a ratio of the slack of said component output node to a worst negative slack raised to a power greater than one.

18. The method of optimizing performance of an integrated circuit design according to claim 17, wherein said delay associated with said component output node is a load-dependent delay of said node.

19. A method of optimizing performance of an integrated circuit design having a plurality of nodes of which a subset are component output nodes, the method comprising the steps of:
   (a) measuring a performance characteristic of said integrated circuit design;
   (b) assigning respective bottleneck numbers to plural ones of said component output nodes, wherein each said bottleneck number characterizes a degree to which optimizing an associated one of said component output nodes will improve said performance characteristic of said integrated circuit design; and
   (c) optimizing one or more said component output nodes based on said bottleneck numbers;
   wherein the assigning step (b) comprises:
      (b1) assigning an end point weight to each end point of said integrated circuit design;
      (b2) assigning a node weight to each node of said integrated circuit design; and
   wherein said bottleneck number for a component output node is based on the node weight of said node;
   wherein the step of assigning a bottleneck number in said step (b) further comprises:
      (b3) computing said bottleneck number for plural ones of said component output nodes proportional to a product of: the weight of said component output node raised to a positive power less than one, and said delay associated with said component output node.

20. The method of optimizing performance of an integrated circuit design according to claim 19, wherein said delay associated with said component output node is a total delay of said node.

21. An integrated circuit design having a plurality of nodes of which a subset are component output nodes optimized according to a method comprising the steps of:
   (a) measuring a performance characteristic of said integrated circuit design;
   (b) assigning respective bottleneck numbers to plural ones of said component output nodes, wherein each said bottleneck number characterizes:
      degree to which optimizing an associated one of said component output nodes will improve said performance characteristic of said integrated circuit design; and
      degree to which the associated one of said component output nodes is capable of being altered to improve said performance characteristic, wherein capability of the associated one of said component output nodes to be altered depends at least in part on its associated delay; and
   (c) optimizing one or more said component output nodes based on said bottleneck numbers.

22. A computer program product comprising a computer usable medium having computer readable program code embodied therein configured to perform method steps to optimize performance of an integrated circuit design having a plurality of nodes of which a subset are component output nodes, said method steps comprising:
   (a) measuring a performance characteristic of said integrated circuit design;
   (b) assigning respective bottleneck numbers to plural ones of said component output nodes, wherein each said bottleneck number characterizes:
      degree to which optimizing an associated one of said component output nodes will improve said performance characteristic of said integrated circuit design; and
      degree to which the associated one of said component output nodes is capable of being altered to improve said performance characteristic, wherein capability of the associated one of said component output nodes to be altered depends at least in part on its associated delay; and
   (c) optimizing one or more said component output nodes based on said bottleneck numbers.

* * * * *